(12) United States Patent
Shin et al.

(10) Patent No.: US 9,297,849 B2
(45) Date of Patent: Mar. 29, 2016

(54) TEST SYSTEM AND METHOD FOR WAFER INCLUDING OPTICAL COMPONENT

(71) Applicant: SAMSUNG ELECTRONICS CO., LTD., Suwon-si, Gyeonggi-do (KR)

(72) Inventors: Dong Jae Shin, Seoul (KR); Yoon Dong Park, Osan-si (KR); Sang Hun Choi, Osan-si (KR); Kyoung Ho Ha, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 80 days.

(21) Appl. No.: 14/159,828

(22) Filed: Jan. 21, 2014

(65) Prior Publication Data

US 2014/0203830 A1   Jul. 24, 2014

(30) Foreign Application Priority Data

Jan. 24, 2013   (KR) ........................ 10-2013-0008306

(51) Int. Cl.
*G02B 6/30*         (2006.01)
*G01R 31/26*       (2014.01)

(52) U.S. Cl.
CPC .................................. *G01R 31/2601* (2013.01)

(58) Field of Classification Search
CPC ........... G02B 6/12004; G02B 6/29352; G02B 6/4224; G02B 6/4214; G02B 6/30; G02B 6/274; G01R 31/311; G01R 31/2886; G01R 31/2887; G01R 31/318511; G01R 31/31728
USPC .......... 385/8, 12, 14, 15, 31, 37, 52; 324/754, 324/750, 756, 762, 754.23, 750.22, 750.23, 324/762.05, 760.01
See application file for complete search history.

(56) References Cited

U.S. PATENT DOCUMENTS

| | | | |
|---|---|---|---|
| 6,859,031 B2 * | 2/2005 | Pakdaman et al. | ............ 324/233 |
| 7,184,626 B1 | 2/2007 | Gunn, III et al. | |
| 7,378,861 B1 * | 5/2008 | Malendevich et al. | .. 324/750.23 |
| 7,386,197 B2 * | 6/2008 | Nikonov et al. | ................ 385/14 |
| 2005/0194990 A1 * | 9/2005 | Gothoskar et al. | ............ 324/765 |

* cited by examiner

*Primary Examiner* — Tung X Nugyen
*Assistant Examiner* — Neel Shah
(74) *Attorney, Agent, or Firm* — F. Chau & Associates, LLC

(57) ABSTRACT

A wafer test system includes an input device configured to transmit a test signal, a wafer including an optical port, an input port configured to receive the test signal, and an output port configured to output a result signal based on the test signal, a measuring device configured to measure the result signal, and an alignment device configured to align an optical fiber port of an optical probe with an alignment port based on the result signal and then align the optical fiber port with the optical port. The alignment port is the input port or the output port. The optical probe is configured to be the input device when the input port is the alignment port and the optical probe is configured to be the measuring device when the output port is the alignment port.

15 Claims, 11 Drawing Sheets

TEST SYSTEM AND METHOD FOR WAFER INCLUDING OPTICAL COMPONENT

CROSS-REFERENCE TO RELATED APPLICATIONS

This application claims priority under 35 U.S.C. §119(a) to Korean Patent Application No. 10-2013-0008306 filed on Jan. 24, 2013, the disclosure of which is hereby incorporated by reference in its entirety.

TECHNICAL FIELD

Embodiments of the inventive concept relate to a test system and method for a wafer including an optical component.

DISCUSSION OF THE RELATED ART

To increase the input/output speed of integrated circuits implemented on a wafer, the use of optical integrated circuits manufactured by integrating optical components in a wafer is gradually increasing. An optical integrated circuit may be integrated with an electrical integrated circuit on a wafer. Such an integrated circuit is called an electro-optical integrated circuit.

Testing a wafer before the wafer is cut into dies and dies are packaged is called a wafer-level test. A defective die may be identified using the wafer-level test and is excluded from the following processes, so that cost and labor can be significantly reduced. An optical probe is used to test electro-optical integrated circuits at a wafer level. The optical fiber of the optical probe may need to be aligned with the optical port of the wafer for the test. When light travels back and forth between the optical fiber of the optical probe and the optical port of the wafer, there may be great sensitivity to an alignment error and the alignment may take a long time.

SUMMARY

According to an embodiment of the inventive concept, there is provided a wafer test system including an input device configured to transmit a test signal, a wafer including an optical port, an input port configured to receive the test signal, and an output port configured to output a result signal based on the test signal, a measuring device configured to measure the result signal, and an alignment device configured to align an optical fiber port of an optical probe with an alignment port based on the result signal and then align the optical fiber port with the optical port. The alignment port is the input port or the output port. The optical probe is configured to be the input device when the input port is the alignment port and the optical probe is configured to be the measuring device when the output port is the alignment port.

The optical port may be separated from the alignment port by a predetermined distance. The alignment between the optical fiber port and the optical port may be performed by shifting a relative position of the optical probe with respect to the wafer by the predetermined distance.

The alignment port may have a wider area on the wafer than the optical port.

The optical probe may be the input device and the alignment port may be the input port.

The wafer may further include a waveguide connected between the alignment port and the output port. The waveguide is configured to transmit the test signal to the output port. The result signal may be an optical signal and the measuring device may be a vision system.

Alternatively, the wafer may further include an opto-electric converter configured to convert the test signal into an electrical signal. The output port may be an electrical pad which is configured to output the electrical signal as the result signal and the measuring device may be an electrical probe.

The opto-electric converter may be included in the alignment port.

The optical probe may be the measuring device and the alignment port may be the output port.

The input device may be an electrical probe and the input port may be an electrical pad. At this time, the wafer may further include an electro-optical converter configured to convert the test signal into an optical signal and the output port may be configured to output the optical signal as the result signal.

The electro-optical converter may be included in the alignment port.

The alignment device may be a wafer positioner, an optical probe positioner or a combination thereof.

According to an exemplary embodiment of the inventive concept, there is provided a wafer test method including transmitting a test signal to an input port of a wafer using an input device, measuring a result signal output from an output port of the wafer based on the test signal using a measuring device, aligning an optical fiber port of an optical probe with an alignment port based on the result signal, and aligning the optical fiber port with an optical port of the wafer. The alignment port is the input port or the output port. The optical probe is configured to be the input device when the input port is the alignment port, and the optical probe is configured to be the measuring device when the output port is the alignment port.

The wafer test method may further include adjusting a relative position of the optical probe and the wafer based on a position of an optical alignment mark of the wafer before the transmitting the test signal.

The aligning the optical fiber port with the alignment port may include adjusting the optical fiber port to place the optical fiber port on a surface of the alignment port and adjusting the optical fiber port to place the optical fiber port at a predetermined position in the alignment port.

The optical port may be separated from the alignment port by a predetermined distance. The aligning the optical fiber port with the optical port may include shifting a relative position of the optical probe with respect to the wafer by the predetermined distance.

The transmitting the test signal through the aligning the optical fiber port with the optical port may be performed before or after the wafer is cut into dies.

According to an exemplary embodiment of the inventive concept, a wafer test system is provided. The wafer test system includes an optical probe configured to transmit a test signal, a wafer including an optical port, an alignment port configured to receive the test signal, an optical output port, an opto-electric converter, an electrical pad, and a waveguide configured to transmit the test signal to the optical output port and configured to transmit the test signal to the opto-electric converter. The optical output port is configured to output the test signal as a first result signal. The opto-electric converter is configured to convert the test signal into an electrical signal and the electrical pad is configured to output the electrical signal as a second result signal.

The wafer test system further includes a vision system configured to measure the first result signal, an electrical probe configured to measure the second result signal and an alignment device configured to align an optical fiber port of the optical probe with the alignment port based on at least one of the first result signal and the second result signal and then align the optical fiber port with the optical port.

BRIEF DESCRIPTION OF THE DRAWINGS

Exemplary embodiments of the inventive concept can be understood in more detail from the following detailed description taken in conjunction with the attached drawings in which.

DETAILED DESCRIPTION OF EXEMPLARY EMBODIMENTS

Figure 1:
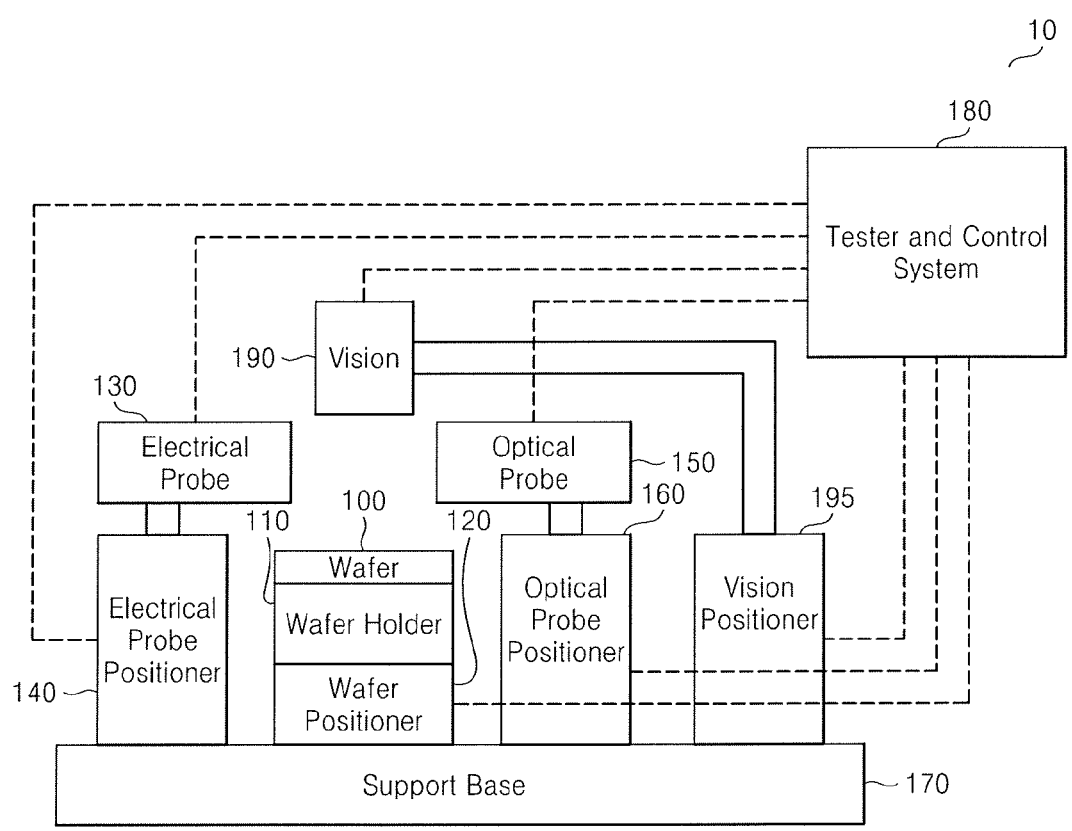
FIG. 1 is a block diagram of a wafer test system according to an exemplary embodiment of the inventive concept.

Exemplary embodiments of the invention may, however, be embodied in many different forms and should not be construed as limited to embodiments set forth herein. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. As used herein, the term "and/or" includes any and all combinations of one or more of the associated listed items.

The terminology used herein is for the purpose of describing particular embodiments only and is not intended to be limiting of exemplary embodiments of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

FIG. 1 is a block diagram of a wafer test system 10 according to an exemplary embodiment of the inventive concept.

The wafer test system 10 may include, for example, a wafer 100, a wafer holder 110, a wafer positioner 120, an electrical probe 130, an electrical probe positioner 140, an optical probe 150, an optical probe positioner 160, a support base 170, a tester and control system 180, a vision system 190, and a vision positioner 195.

The wafer 100 may be, for example, a wafer before being cut into dies. Alternatively, in an embodiment, the wafer 100 may be, for example, a die obtained after a wafer is cut into dies. The wafer holder 110 supports the wafer 100. The wafer holder 110 may be implemented by, for example, a wafer chuck.

The wafer positioner 120 supports the wafer holder 110 and adjusts the horizontal and vertical position and the orientation of the wafer 100. The wafer positioner 120 moves the wafer 100 to locate a die to be tested at a predetermined stationary position where an electrical and optical test is performed. The wafer positioner 120 also moves a component of the die to positions corresponding to the electrical probe 130 and the optical probe 150.

The electrical probe 130 may test, for example, an electronic component, an optoelectronic component, and an electro-optical component of a die on the wafer 100. The electrical probe 130 may be, for example, a radio frequency (RF) or direct current (DC) probe having at least one electrically conductive tip or needle as a contact lead. The electrical probe 130 may include, for example, at least one contact lead (not shown) that applies at least one test signal to the die and receives at least one result signal from the die. The result signal may be generated, for example, in response to light. The electrical probe 130 may include, for example, a plurality of contact leads to test a plurality of electronic components.

The electrical probe positioner 140 locates and supports the electrical probe 130 on the wafer 100. The electrical probe positioner 140 may be manually controlled by a user or automatically controlled by a motorized control mechanism. The electrical probe positioner 140 may precisely adjust the position of the electrical probe 130 in a die area so that the contact lead of the electrical probe 130 is aligned with an electrical pad of the die. The optical probe 150 may include, for example, at least one optical fiber or at least one optical fiber port. The optical probe 150 will be described in detail with reference to FIG. 3 later.

The wafer test system 10 may include, for example, two optical probes 150 supported by two optical probe positioners 160. For instance, the first optical probe 150 may transmit light to the wafer 100 and the second optical probe 150 may receive reflected probe light or light output from an optical port of the wafer 100. In an embodiment, more optical probes 150 may be added.

The optical probe positioner 160 supports an external optical device positioned on the wafer 100 or a separated die to perform an optical test. The external optical device may be, for example, the optical probe 150. The operations of the wafer positioner 120, the electrical probe positioner 140, and the optical probe positioner 160 during the optical test will be described below.

The wafer positioner 120 adjusts the horizontal and vertical position of the wafer 100 so that the wafer 100 is located at a predetermined initial position below the optical probe 150. The wafer positioner 120 may include, for example, a single parallel positioner or a combination of parallel positioners that controls the horizontal position and the vertical position of the wafer 100 supported by the wafer holder 110. For instance, two one-dimensional positioners may be combined to adjust a position of the wafer 100 in two orthogonal horizontal directions X and Y and a third one-dimensional positioner may be used to control a position of the wafer 100 in a vertical direction Z. The wafer positioner 120 may also include, for example, a declination adjuster (not shown) that adjusts the direction of the wafer 100 with respect to the vertical axis Z.

The wafer positioner 120 may have, for example, two predetermined fixed vertical positions, e.g., a "test position" and a lower "separate position" to control the vertical position of the wafer 100. The wafer positioner 120 separates the wafer 100 from the electrical probe 130 and the optical probe 150 at the separate position. The wafer positioner 120 lifts the wafer 100 at the test position so that the wafer 100 contacts the electrical probe 130 and is close to the optical probe 150 with a predetermined gap in the vertical direction. Therefore, the electrical test and the optical test can be performed at the test position. After the wafer positioner 120 adjusts the wafer 100 to the test position, the electrical probe positioner 140 may adjust the vertical position of the electrical probe 130 for the electrical test so that the electrical probe 130 contacts the wafer 100. The optical probe positioner 160 may precisely adjust the vertical position of the optical probe 150 for the optical test so that the vertical gap between the optical probe 150 and the wafer 100 is the predetermined gap. The optical probe positioner 160 may finely adjust the declination of the optical probe 150 when the optical probe 150 includes a linear array of optical fibers.

Optical alignment for the optical test may require high accuracy. The wafer test system 10 precisely adjusts the position and direction of the optical probe 150 with respect to the wafer 100 using the optical probe positioner 160, thereby optimizing the optical alignment.

The support base 170 supports the wafer positioner 120, the electrical probe positioner 140, the optical probe positioner 160, and the vision positioner 195.

The tester and control system 180 controls the operations and tests of the wafer test system 100. The tester and control system 180 may include, for example, at least one microprocessor or computer that performs various processing and control operations and other electronic devices. An optical integrated circuit, an electrical integrated circuit, or other components may be registered and represented with location coordinates in the design of a die pattern in the wafer 100 and a position map may be generated from the design. Data of the position map may be stored in, for example, an internal memory, a disk, or a portable memory medium or device and used by the tester and control system 180. The wafer positioner 120 may shift a die and a component of the die to a stationary position below the optical probe 150 according to the position map. The electrical probe positioner 140 may align the electrical probe 130 with the die based on the position map.

The tester and control system 180 may include, for example, a test unit that tests electrical and optical components. The test unit may generate and transmit an electrical probe signal to the wafer 100 and receive an electrical signal from the wafer 100 when performing an electrical test. The test unit may also generate and transmit probe light to the wafer 100 and receive an optical signal from the wafer 100 when performing an optical test. The tester and control system 180 may perform, for example, an optical test, an electrical test, and an optoelectronic test on the wafer 100 or a separated die mounted on the wafer positioner 120 using, for example, at least one electrical probe 130 and the optical probe 150. For example, the optical test, the electrical test, and the optoelectronic test may be performed at a wafer level before the wafer 100 is cut into dies.

The optical alignment for the optical test may require higher accuracy than the alignment of an optical pad for the electrical test in the wafer test system 10. The tester and control system 180 may include, for example, a fine alignment control mechanism to achieve high accuracy. An entire optical alignment control mechanism may be implemented in different parts of the wafer test system 100 and the parts may associate with each other to operate.

The vision system 190 may include, for example, a light source emitting light for a test and a scan camera capturing reflected or transmitted light of the light emitted from the light source. The tester and control system 180 may control, for example, the wafer positioner 120, the electrical probe positioner 140, and the optical probe positioner 160 according to an output of the scan camera.

The vision positioner 195 may support the vision system 190 and adjust the position of the vision system 190. Alternatively, in an exemplary embodiment, the wafer test system 10 may not include the vision positioner 195 i.

Figure 2:
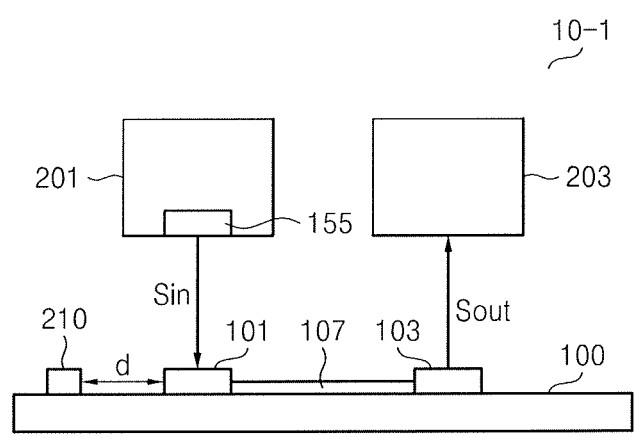
FIG. 2 is a diagram showing in detail the wafer test system 10 illustrated in FIG. 1 according to an exemplary embodiment of the inventive concept.

FIG. 2 is a diagram showing in detail the wafer test system 10 illustrated in FIG. 1 according to an embodiment of the inventive concept. Referring to FIG. 2, a wafer test system 10-1 includes, for example, an input device 201, a measuring device 203, the wafer 100, and an alignment device.

The input device 201 transmits a test signal Sin to the wafer 100. The wafer 100 includes, for example, an input port 101 receiving the test signal Sin and an output port 103 transmitting a result signal Sout based on the test signal Sin. The wafer 100 may also include, for example, a transfer line 107 connected between the input port 101 and the output port 103 to transmit the test signal Sin to the output port 103. The transfer line 107 may be, for example, a waveguide. The measuring device 203 measures the result signal Sout.

The alignment device aligns an optical fiber port 155 of the optical probe 150 with an alignment port based on the result signal Sout. The alignment device may perform the alignment by, for example, shifting the wafer 100 or the optical probe 150.

The alignment device may be, for example, the wafer positioner 120, the optical probe positioner 160, or a combination thereof.

The optical probe 150 may be, for example, the input device 201 or the measuring device 203. The alignment port may be, for example, the input port 101 or the output port 103. FIG. 2 illustrates a case where the optical probe 150 is the input device 201 and the alignment port is the input port 101. However, alternatively, for example, in an embodiment, the optical probe 150 may be the output device 203 and the alignment port may be the output port 103.

The wafer 100 may also include, for example, an optical port 210 separated from the alignment port by a predetermined distance "d". The alignment device 120 and/or 160 may align the optical fiber port 155 with the alignment port (220 in FIG. 3A) and then align the optical fiber port 155 with an optical port (210 in FIG. 3A).

Hereinafter, an embodiment in which the optical probe 150 is the input device 201 and the alignment port 220 is the input port 101 will be described with reference to FIGS. 3A, 3B, 7A, 7B, and 8. In this embodiment, alignment is performed using, for example, light traveling from the optical probe 150 to the wafer 100.

Figure 3A:
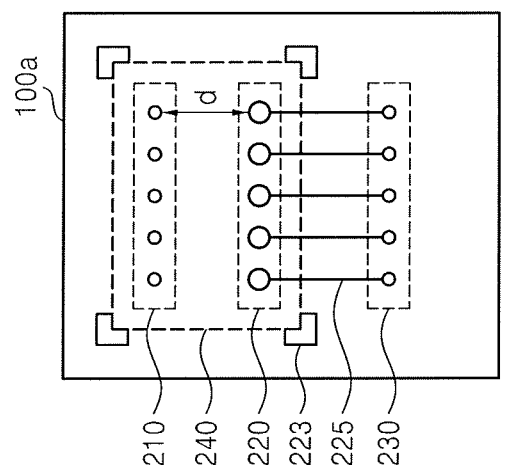
FIGS. 3A and 3B are detailed diagrams of a wafer test system corresponding to the wafer test system illustrated in FIG. 2.
Figure 3B:
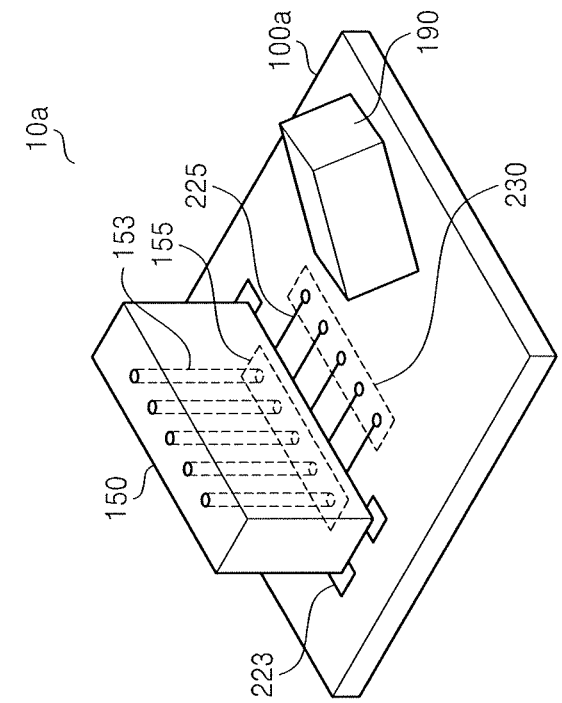

FIGS. 3A and 3B are detailed diagrams of a wafer test system 10a corresponding to the wafer test system 10-1 illustrated in FIG. 2. FIG. 3A is a plan view of a wafer 100a corresponding to the wafer 100 illustrated in FIG. 2 and FIG. 3B is a perspective view of the wafer test system 10a.

Referring to FIGS. 3A and 3B, the wafer test system 10a includes, for example, the wafer 100a, the optical probe 150, and the vision system 190. The wafer 100a includes, for example, the optical port 210, the alignment port 220, an optical alignment mark 223, a waveguide 225, and an output port 230. The optical probe 150 illustrated in FIG. 3B corresponds to the input device 201 illustrated in FIG. 2. The alignment port 220 illustrated in FIG. 3A corresponds to the input port 101 illustrated in FIG. 2. The output port 230 illustrated in FIG. 3A corresponds to the output port 103 illustrated in FIG. 2. The vision system 190 illustrated in FIG. 3B corresponds to the measuring device 203 illustrated in FIG. 2.

Referring to FIGS. 1, 3A, and 3B, the optical probe 150 may include, for example, at least one optical fiber 153 and at least one optical fiber port 155. The optical fiber 153 may transmit an optical signal from the wafer 100a through the optical fiber port 155 to the tester and control system 180. The optical fiber 153 may transmit an optical signal from the tester and control system 180 to the wafer 100a through the optical fiber port 155. The optical fiber port 155 may transmit a probe beam to the wafer 100a from a predetermined height above the surface of the wafer 100a and may receive a light beam from the surface of the wafer 100a.

The optical probe 150 outputs the test signal Sin to the wafer 100a. The vision system 190 measures the result signal Sout output from the output port 230.

The optical port 210 is used to input an external optical signal to an electro-optical integrated circuit or output an optical signal from the electro-optical integrated circuit during the operation of the electro-optical integrated circuit. The alignment port 220 receives the test signal Sin from the optical fiber port 155 of the optical probe 150.

The optical alignment mark 223 may be placed, for example, at the edge of a portion 240 of the wafer 100a, which is covered with the optical probe 150 when the optical probe 150 is placed at a predetermined position on the wafer 100a. The alignment device 120 and/or 160 may, for example, shift the optical probe 150 to the predetermined position on the wafer 100a based on the optical alignment mark 223 before aligning the alignment port 220 with the optical fiber port 155. The waveguide 225 is connected between the alignment port 220 and the output port 230 to transmit the test signal to the output port 230. The output port 230 is placed outside the portion 240 and outputs the result signal Sout based on the test signal.

Figure 4:
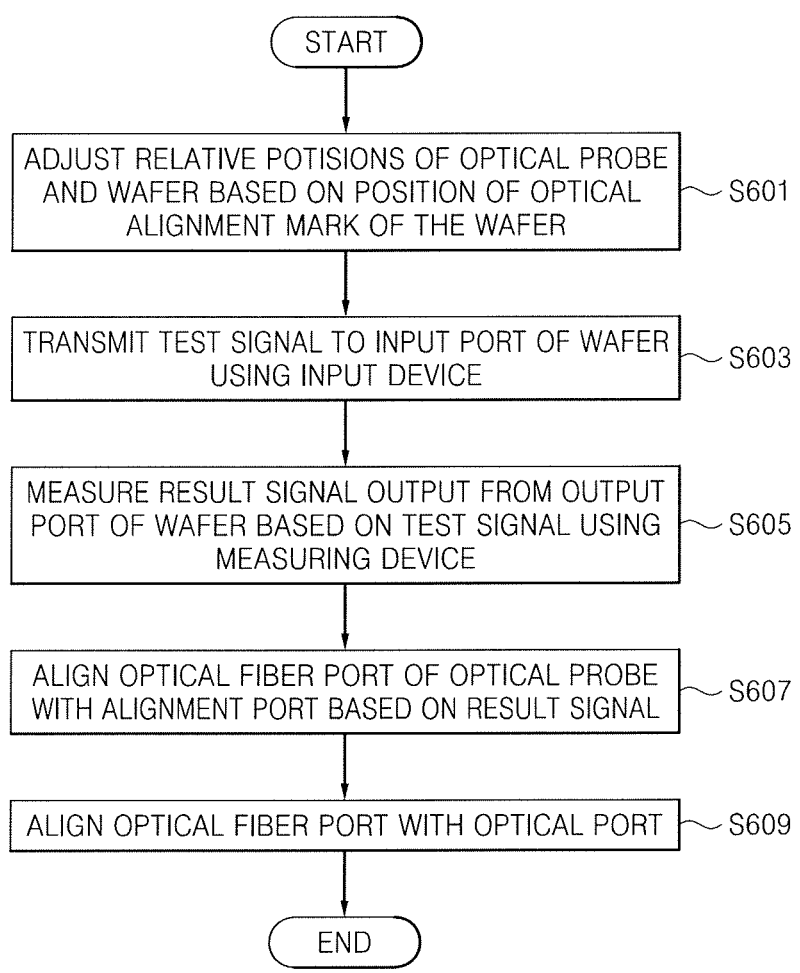
FIG. 4 is a flowchart of a wafer test method according to an exemplary embodiment of the inventive concept.

FIG. 4 is a flowchart of a wafer test method according to an embodiment of the inventive concept. Referring to FIGS. 3A, 3B, and 4, the wafer positioner 120 and the optical probe positioner 160 adjust the relative position of the optical probe 150 and the wafer 100a based on the position of the optical alignment mark 223 of the wafer 100a in operation S601. For example, the light source of the vision system 190 emits illumination light to the wafer 100a and the scan camera of the vision system 190 measures light reflected from the wafer 100a. The tester and control system 180 controls the wafer positioner 120 according to the reflected light to shift the wafer 100a so that each apex of the optical probe 150 is positioned at the optical alignment mark 223 of the wafer 100a.

The input device 201 transmits the test signal Sin to the input port 101 of the wafer 100a in operation S603. In other words, the optical probe 150 transmits the test signal Sin to the alignment port 220. The alignment port 220 transmits the test signal Sin to the output port 230 through the waveguide 225.

The measuring device 203 measures the result signal Sout output from the output port 103 of the wafer 100a based on the test signal Sin in operation S605. In other words, the scan camera of the vision system 190 measures light output as the result signal Sout from the output port 230.

The alignment device 120 and/or 160 or the combination thereof aligns the optical fiber port 155 of the optical probe 150 with the alignment port 220 in operation S607. Thereafter, the alignment device 120 and/or 160 aligns the optical fiber port 155 with the optical port 210 in operation S609. Operations S607 and S609 will be described in detail with reference to FIGS. 5 and 6 below.

Figure 5:
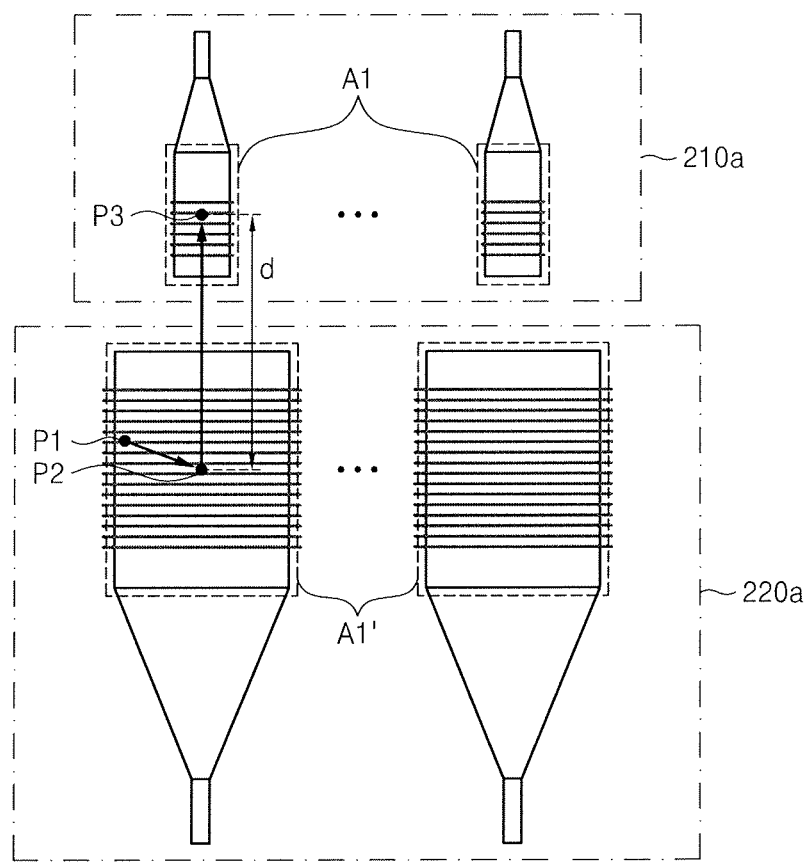
FIG. 5 is a plan view of an optical port and an alignment port according to an exemplary embodiment of the inventive concept.
Figure 6:
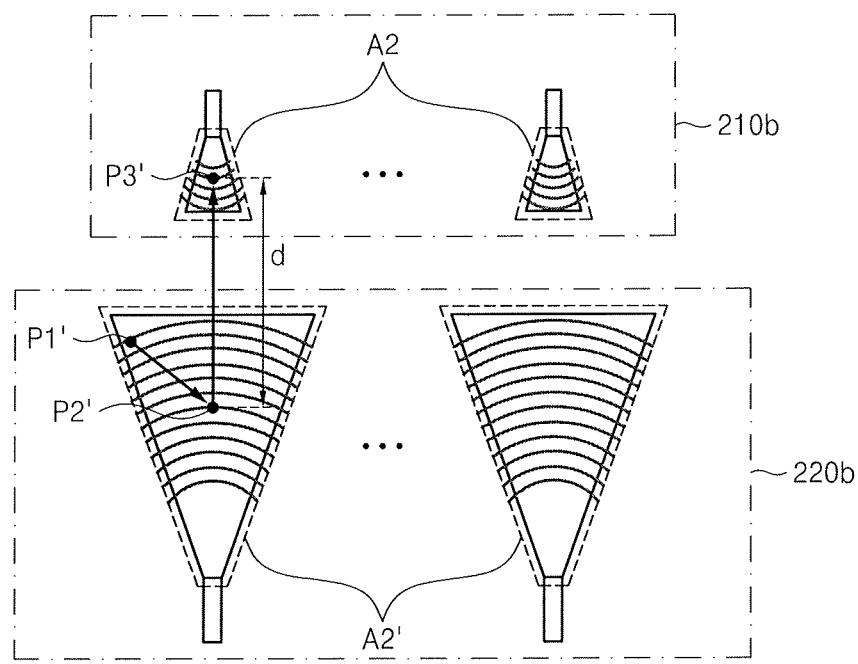
FIG. 6 is a plan view of an optical port and an alignment port according to an exemplary embodiment of the inventive concept.

FIG. 5 is a plan view of an optical port and an alignment port according to an embodiment of the inventive concept. FIG. 6 is a plan view of an optical port and an alignment port according to an embodiment of the inventive concept.

Referring to FIGS. 3A through 6, the alignment device 120 and/or 160 adjusts the relative position of the optical fiber port 155 of the optical probe 150 and the alignment port 220 based on the result signal Sout in operation S607. For instance, the alignment device 120 and/or 160 may adjust the relative position of the optical fiber port 155 and the alignment port 220 until the magnitude of the result signal Sout is at least a predetermined value. The adjustment of the relative position may be carried out by, for example, adjusting the optical fiber port 155 to place the optical fiber port 155 on a surface P1 or P1' of the alignment port 220 and adjusting the optical fiber port 155 to place the optical fiber port 155 at a predetermined position P2 or P2' in the alignment port 220. The predetermined position P2 or P2' in the alignment port 220 may be, for example, the center of the alignment port 220.

The alignment device 120 and/or 160 aligns the optical fiber port 155 with the optical port 210 in operation S609. A predetermined position P3 or P3' in the optical port 210 is, for example, separated from the predetermined position P2 or P2' in the alignment port 220 by the predetermined distance "d". The alignment device 120 and/or 160 adjusts the optical fiber port 155 to place the optical fiber port 155 at the predetermined position P2 or P2' in the alignment port 220 and then shifts the position of the optical probe 150 by the predetermined distance "d" with respect to the wafer 100a. In other words, the alignment device 120 and/or 160 adjusts the wafer 100a or the optical probe 150 so that the optical fiber port 155 is located at the predetermined position P3 or P3' in the optical port 210. Thereafter, the alignment device 120 and/or 160 may, for example, perform additional alignment to maximize the accuracy.

A surface area A1' or A2' of the alignment port 220 is, for example, greater than a surface area A1 or A2 of the optical port 210 on the wafer 100a. When the optical fiber port 155 is directly aligned with the optical port 210 having the relatively narrow area, this alignment may require high accuracy and take a long period of time. When the optical fiber port 155 is aligned with the optical port 210 using the alignment port 220 having the relatively wider area, the alignment can be accomplished more quickly.

Although the optical port 210 and the alignment port 220 have a rectangular or trapezoidal shape illustrated in FIGS. 5 and 6, the optical port 210 and the alignment port 220 may alternatively be implemented in other shapes in an embodiment.

Figure 7A:
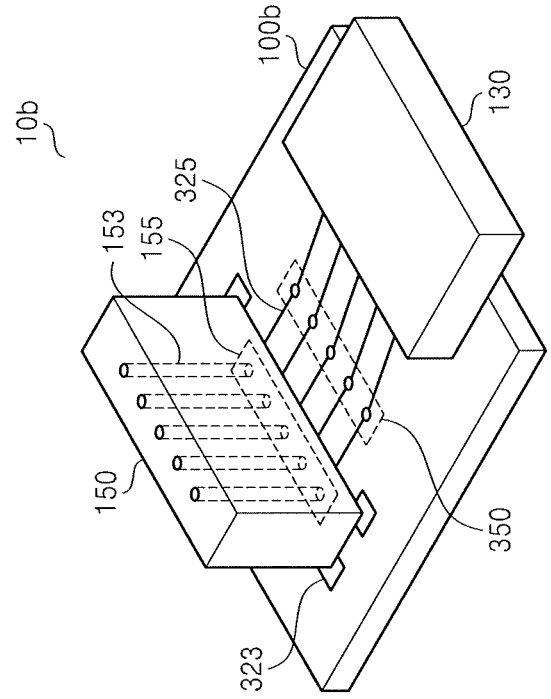
FIGS. 7A and 7B are diagrams of a wafer test system according to an exemplary embodiment of the inventive concept.
Figure 7B:
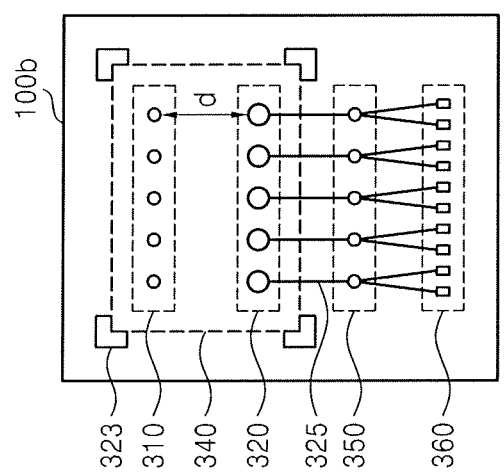

FIGS. 7A and 7B are diagrams of a wafer test system 10b according to an embodiment of the inventive concept. FIG. 7A is a plan view of a wafer 100b corresponding to the wafer 100 illustrated in FIG. 1. FIG. 7B is a perspective view of the wafer test system 10b corresponding to the wafer test systems 10 and 10-1 illustrated in FIGS. 1 and 2.

Referring to FIGS. 7A and 7B, the wafer test system 10b includes, for example, the wafer 100b, the optical probe 150, and the electrical probe 130. The wafer 100b includes, for example, an optical port 310, an alignment port 320, an optical alignment mark 323, a waveguide 325, an opto-electric converter 350, and an electrical pad 360. The structure and the test method of the wafer test system 10b illustrated in FIGS. 7A and 7B are almost the same as those of the wafer test system 10a illustrated in FIGS. 3A and 3B, and therefore, the differences therebetween will be mainly described.

The optical probe 150 illustrated in FIG. 7B corresponds to the input device 201 illustrated in FIG. 2. The alignment port 320 illustrated in FIG. 7A corresponds to the input port 101 illustrated in FIG. 2. The electrical pad 360 illustrated in FIG. 7A corresponds to the output port 103 illustrated in FIG. 2. The electrical probe 130 illustrated in FIG. 7B corresponds to the measuring device 203 illustrated in FIG. 2.

The electrical pad 360 and the opto-electric converter 350 are placed outside a portion 340 of the wafer 100b, which is covered with the optical probe 150. However, the opto-electric converter 350 may alternatively be placed in the portion 340 covered with the optical probe 150 in an embodiment.

The optical probe 150 transmits the test signal Sin to the alignment port 320. The alignment port 320 transmits the test signal Sin to the opto-electric converter 350 through the waveguide 325. The opto-electric converter 350 converts the test signal Sin into an electrical signal and transmits the electrical signal to the electrical pad 360. The electrical pad 360 outputs the electrical signal as the result signal Sout to the electrical probe 130. The alignment device 120 and/or 160 aligns the optical fiber port 155 of the optical probe 150 with the alignment port 320 based on the result signal Sout measured by the electrical probe 130 and then aligns the optical fiber port 155 with the optical port 310.

Figure 8:
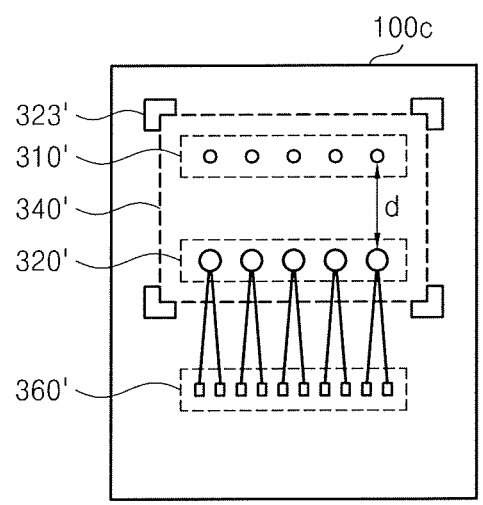
FIG. 8 is a plan view of a wafer according to an exemplary embodiment of the inventive concept.

FIG. 8 is a plan view of a wafer 100c according to an embodiment of the inventive concept. Referring to FIG. 8, the wafer 100c includes, for example, an optical port 310', an optical alignment mark 323', an alignment port 320', and an electrical pad 360'. The structure and the test method of the wafer 100c illustrated in FIG. 8 are almost the same as those of the wafer 10b illustrated in FIG. 7A, and therefore, the differences therebetween will be mainly described.

The optical probe 150 transmits the test signal Sin and the alignment port 320' receives the test signal Sin. The alignment port 320' includes, for example, an opto-electric converter, which converts the test signal Sin into an electrical signal. The alignment port 320' transmits the electrical signal to the electrical pad 360'. The electrical pad 360' outputs the electrical signal as the result signal Sout to the electrical probe 130.

In the above-described embodiments, the optical probe 150 is the input device 201, the alignment port 220, 320, or 320' is the input port 101, and alignment is carried out using light traveling from the optical probe 150 to the wafer 100. However, alternatively, in an embodiment, the optical probe 150 is the measuring device 203, the alignment port 220, 320, or 320' is the output port 103, and alignment is carried out using light traveling from the wafer 100 to the optical probe 150. Hereinafter, an embodiment will be described in detail with reference to FIGS. 9 and 10.

Figure 9:
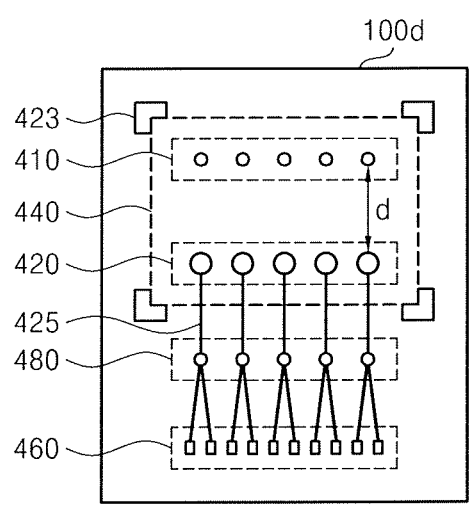
FIG. 9 is a plan view of a wafer according to an exemplary embodiment of the inventive concept.

FIG. 9 is a plan view of a wafer 100d according to an embodiment of the inventive concept. Referring to FIG. 9, the wafer 100d includes, for example, an optical port 410, an alignment port 420, an optical alignment mark 423, a waveguide 425, an electro-optical converter 480, and an electrical pad 460. A wafer test system for testing the wafer 100d illustrated in FIG. 9 is almost the same as the wafer test system 10b illustrated in FIG. 7B. The differences between the wafer 100d illustrated in FIG. 9 and the wafer 100b illustrated in FIG. 7A will be mainly described.

The electrical probe 130 illustrated in FIG. 7B is included in the present embodiment and corresponds to the input device 201 illustrated in FIG. 2. The electrical pad 460 illustrated in FIG. 9 corresponds to the input port 101 illustrated in FIG. 2. The alignment port 420 illustrated in FIG. 9 corresponds to the output port 103 illustrated in FIG. 2. The optical probe 150 illustrated in FIG. 7B is included in the present embodiment and corresponds to the measuring device 203 illustrated in FIG. 2. The electrical pad 460 and the electro-optical converter 480 are placed outside a portion 440 covered with the optical probe 150 on the wafer 100d. However, alternatively, the electro-optical converter 480 may be placed in the portion 440 covered with the optical probe 150 in an embodiment.

The electrical probe 130 transmits the test signal Sin. The electrical pad 460 receives the test signal Sin and transmits it to the electro-optical converter 480. The electro-optical converter 480 converts the test signal Sin into an optical signal. The waveguide 425 is connected between the electro-optical converter 480 and the alignment port 420 and transmits the optical signal to the alignment port 420. The alignment port 420 outputs the optical signal as the result signal Sout. The optical probe 150 measures the result signal Sout. The alignment device 120 and/or 160 aligns the optical fiber port 155 of the optical probe 150 with the alignment port 420 based on the measurement result and then aligns the optical fiber port 155 with the optical port 410.

Figure 10:
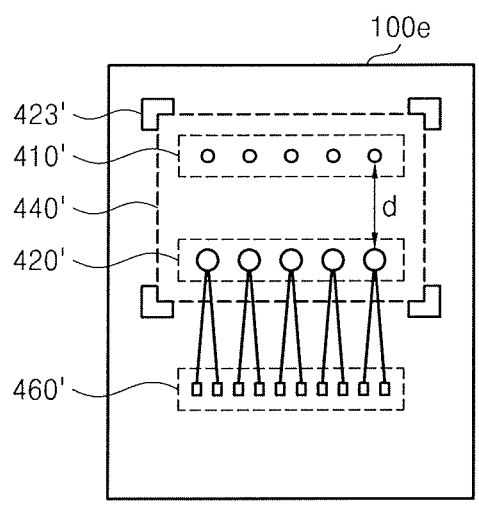
FIG. 10 is a plan view of a wafer according to an exemplary embodiment of the inventive concept.

FIG. 10 is a plan view of a wafer 100e according to an embodiment of the inventive concept. Referring to FIGS. 9 and 10, the wafer 100e includes, for example, an optical port 410', an alignment port 420', an optical alignment mark 423', and an electrical pad 460'. The structure and the test method of the wafer 100e illustrated in FIG. 10 are almost the same as those of the wafer 100d illustrated in FIG. 9, and therefore, the difference therebetween will be mainly described.

The electrical probe 130 transmits the test signal Sin. The electrical pad 460' receives the test signal Sin and transmits it to the alignment port 420'. The alignment port 420' includes, for example, an electro-optical converter, which converts the test signal Sin into an optical signal. The alignment port 420' outputs the optical signal as the result signal Sout.

Figure 11:
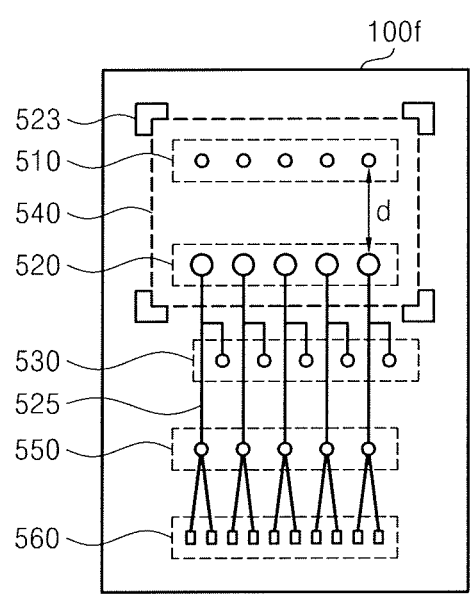
FIG. 11 is a plan view of a wafer according to an exemplary embodiment of the inventive concept.

FIG. 11 is a plan view of a wafer 100f according to an embodiment of the inventive concept. Referring to FIG. 11, the wafer 100f includes, for example, an optical port 510, an alignment port 520, an optical alignment mark 523, a waveguide 525, an optical output port 530, an opto-electric converter 550, and an electrical pad 560. The structure and the test method of the wafer 100f illustrated in FIG. 11 are almost the same as those of the wafer 100a or 100b illustrated in FIG. 3A or 7A, and therefore, the difference therebetween will be mainly described.

The optical probe 150 transmits the test signal Sin. The alignment port 520 of the wafer 100f receives the test signal Sin. The waveguide 525 transmits the test signal Sin to the optical output port 530. The optical output port 530 outputs the test signal Sin as a first result signal. The waveguide 525 also transmits the test signal Sin to the opto-electric converter 550. The opto-electric converter 550 converts the test signal Sin into an electrical signal and transmits the electrical signal to the electrical pad 560. The electrical pad 560 outputs the electrical signal as a second result signal.

The measurement of the result signal Sout may be performed by, for example, at least one of the vision system 190 and the electrical probe 130. When the optical output port 530 includes a plurality of ports and the first result signal output from the optical output port 530 is measured using the vision system 190, the outputs of all ports of the optical output port 530 are sensed by a scan camera at one time. Therefore, quick measurement is accomplished. Meanwhile, the second result signal output from the electrical pad 560 is measured using the electrical probe 130, and therefore, even a weak optical signal can be measured based on the converted electrical signal. As a result, measurement sensibility is increased.

The wafer 100f illustrated FIG. 11 is embodied by combining the wafer test system in FIG. 3A and the wafer test system illustrated in FIG. 7A. Wafers may also be embodied by combining the wafer test system illustrated in FIG. 3A and the wafer test system illustrated in FIG. 8. For instance, in an embodiment, the alignment port 520 may include an opto-electric converter and may be connected with the optical output port 530 and the electrical pad 560. At this time, a wafer may output an optical signal as a first result signal through the optical output port 530 and may output an electrical signal as a second result signal through the electrical pad 560. Other wafers may also be embodied by combining the above-described wafer test systems.

As described above, according to embodiments of the inventive concept, a wafer test system uses light traveling only in one direction between a wafer and an optical probe, thereby reducing sensitivity to an alignment error and increasing alignment speed. In addition, the wafer test system uses an alignment port that is separated from an optical port by a predetermined distance and has a wider area than the optical port on the wafer, thereby reducing alignment time.

Having described exemplary embodiments of the inventive concept, it is further noted that it is readily apparent to those of ordinary skill in the art that various modifications may be made without departing from the spirit and scope of the invention which is defined by the metes and bounds of the appended claims.

What is claimed is:

1. A wafer test system comprising: an input device configured to transmit a test signal; a wafer comprising an optical port, an input port configured to receive the test signal, and an output port that is separate from the input port and is configured to output a result test signal based on the test signal, wherein one of the input port and the output port being an alignment port . . . wafer to the optical probe.

2. The wafer test system of claim 1,
wherein the optical port and the alignment port are disposed together within a single section delineated by a set of optical alignment marks and the optical port is separated from the alignment port, within the single section, by a predetermined distance, and the alignment device is configured to shift a relative position of the optical probe with respect to the wafer by the predetermined distance to align the optical fiber port with the optical port, and wherein a port of the input port and output port that is not the alignment port is located outside of the single section.

3. The wafer test system of claim 2, wherein the alignment port has a wider area on the wafer than the optical port.

4. The wafer test system of claim 1, wherein the optical probe is the input device and the alignment port is the input port.

5. The wafer test system of claim 4, wherein the wafer further comprises a waveguide connected between the alignment port and the output port, wherein the waveguide is configured to transmit the test signal to the output port, wherein the result signal is an optical signal, and wherein the measuring device is a vision system.

6. The wafer test system of claim 4, wherein the wafer further comprises an opto-electric converter configured to convert the test signal into an electrical signal, wherein the output port is an electrical pad, wherein the electrical pad is configured to output the electrical signal as the result signal, and wherein the measuring device is an electrical probe.

7. The wafer test system of claim 6, wherein the opto-electric converter is included in the alignment port.

8. The wafer test system of claim 1, wherein the optical probe is the measuring device and the alignment port is the output port.

9. The wafer test system of claim 8, wherein the input device is an electrical probe, wherein the input port is an electrical pad, wherein the wafer further comprises an electro-optical converter configured to convert the test signal into an optical signal, and wherein the output port is configured to output the optical signal as the result signal.

10. The wafer test system of claim 9, wherein the electro-optical converter is included in the alignment port.

11. The wafer test system of claim 1, wherein the alignment device is one selected from the group consisting of a wafer positioner, an optical probe positioner, or a combination thereof.

12. A wafer test system comprising: an optical probe configured to transmit a test signal; a wafer comprising an optical port, an alignment port configured to receive the test signal, an optical output port that is separate from the alignment port, an opto-electric converter . . . portion of the wafer outside of the first area.

13. The wafer test system of claim 12, wherein the opto-electric converter is included in the alignment port.

14. A wafer comprising: an input port configured to receive a test signal; an output port that is separate from the input port and is configured to output a result signal based on the test signal . . . outside of the signal section.

15. The wafer of claim 14, wherein the test signal is the optical signal, and the result signal comprises at least one of an optical signal and an electrical signal.

* * * * *